United States Patent
Chiang et al.

(10) Patent No.: US 6,797,979 B2
(45) Date of Patent: Sep. 28, 2004

(54) METAL STRUCTURE FOR A PHASE-CHANGE MEMORY DEVICE

(75) Inventors: Chien Chiang, Fremont, CA (US); Jong-Won Lee, Santa Clara, CA (US); Patrick Klersy, Lake Orion, MI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/418,530

(22) Filed: Apr. 17, 2003

(65) Prior Publication Data

US 2003/0193063 A1 Oct. 16, 2003

Related U.S. Application Data

(62) Division of application No. 09/745,835, filed on Dec. 21, 2000, now Pat. No. 6,569,705.

(51) Int. Cl.[7] .............................................. H01L 47/00
(52) U.S. Cl. ................... 257/4; 257/3; 257/5; 257/41; 257/50; 257/300; 257/529; 257/530
(58) Field of Search ............................... 257/3, 4, 5, 41, 257/50, 300, 529, 530; 365/182, 108

(56) References Cited

U.S. PATENT DOCUMENTS

| | | | | | |
|---|---|---|---|---|---|
| 5,166,758 | A | * | 11/1992 | Ovshinsky et al. | 257/3 |
| 5,789,758 | A | * | 8/1998 | Reinberg | 257/3 |
| 5,933,365 | A | * | 8/1999 | Klersy et al. | 365/148 |
| 6,189,582 | B1 | * | 2/2001 | Reinberg et al. | 438/239 |
| 6,284,643 | B1 | * | 9/2001 | Reinberg | 438/622 |
| 6,339,544 | B1 | * | 1/2002 | Chiang et al. | 365/163 |
| 6,392,302 | B1 | * | 5/2002 | Hu | 257/775 |
| 6,437,383 | B1 | * | 8/2002 | Xu | 257/300 |

* cited by examiner

Primary Examiner—Anh Phung
Assistant Examiner—Douglas Menz
(74) Attorney, Agent, or Firm—Tony M. Martinez

(57) ABSTRACT

The invention relate to a damascene chalcogenide memory cell structure. The damascene chalcogenide memory cell structure is fabricated under conditions that simplify previous process flows. The damascene chalcogenide memory cell structure also prevents volatilization of the chalcogenide memory material.

62 Claims, 15 Drawing Sheets

METAL STRUCTURE FOR A PHASE-CHANGE MEMORY DEVICE

This is a divisional of application Ser. No. 09/745,835, filed Dec. 21, 2000 now U.S. Pat. No. 6,569,705.

BACKGROUND OF THE INVENTION

1. Field of the Invention

The present invention relates to a phase-change memory device. More particularly, the present invention relates to an upper electrode in a chalcogenide memory cell. In particular, the present invention relates to a damascene structure select line in a phase-change memory cell structure.

2. Description of Related Art

Typical memory applications include dynamic random access memory (DRAM), static random access memory (SRAM), erasable programmable read only memory (EPROM), and electrically erasable programmable read only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One aspect of fabrication deals with the complexity of the chalcogenide material. Because of its unusual behavior in the semiconductor processing regime, measures must be taken to avoid creating a fugitive material during routine thermal processes. Additionally, because it is more chemically reactive than several conventional materials used in the semiconductor processing regime, damage to the chalcogenide material is likely. Other measures must be taken to facilitate the patterning of the memory material.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The invention generally relates to an apparatus used, in one aspect, as a memory structure. In one embodiment, the apparatus includes a volume of memory material between a pair of spacedly disposed conductors or signal lines. The apparatus also includes an electrode coupled to a volume of memory material and disposed between the volume of memory material and one conductor or signal line. The upper electrode is disposed in a damascene structure that simplifies process flow and solves processing problems that existed previously.

The invention also relates to a method, including a method of forming a memory element. In one aspect, the method includes, between contacts formed on a substrate, introducing an upper electrode material into a damascene structure under process conditions that lead to higher product yield and lower field failures.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photonicrograph, may appear different while still incorporating the essential structures of the present invention. Moreover, the drawings show only the structures necessary to understand the present invention. Additional structures known in the art have not been included to maintain the clarity of the drawings.

Figure 1:
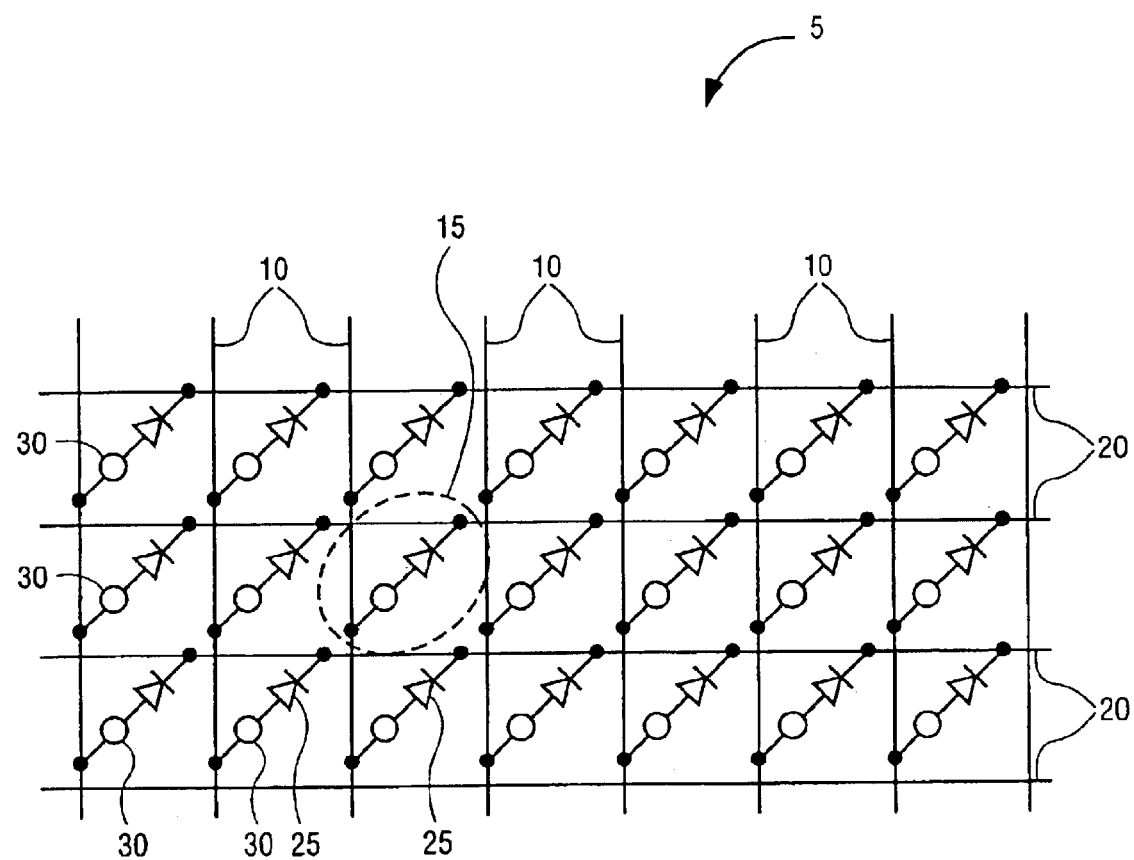
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
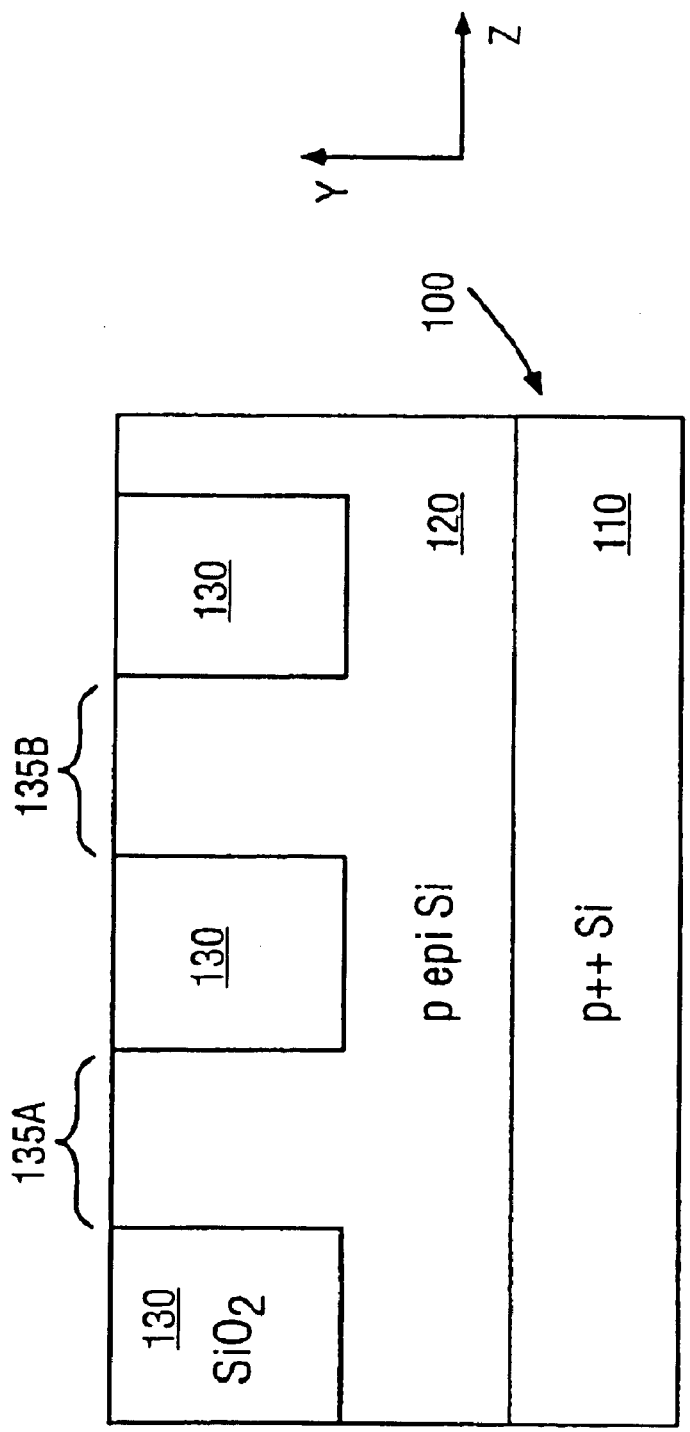
FIG. 2 schematically illustrates a cross-section elevational view of a portion of a semiconductor substrate having dielectric trenches formed therein defining a z-direction thickness of a memory cell in accordance with one embodiment of the invention of forming a memory element on a substrate.

FIGS. 2–15 illustrate the fabrication of representative memory element 15 of FIG. 1. FIG. 2 shows a portion of substrate 100 that is, for example, a semiconductor substrate. In this example, a P-type dopant such as boron is introduced in a deep portion 110. In one example, a suitable concentration of P-type dopant is on the order of above $5\times10^{19}$–$1\times10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16}$–$10^{17}$ atoms/cm$^3$. The introduction and formation of epitaxial portion 120 as P-type, and deep portion 110 may follow techniques known to those of skill in the art FIG. 2 also shows first shallow trench isolation (STI) structures 130 formed in epitaxial portion 120 of substrate 100. As will become apparent in the subsequent discussion, STI structures 130 serve, in one aspect, to define the z-direction thickness of a memory element cell, with at this point only the z-direction thickness of a memory element cell defined. In another aspect, STI structures 130 serve to isolate individual memory elements from one another as well as associated circuit elements such as transistor devices formed in and on substrate 100. STI structures 130 are formed according to techniques known to those skilled in the art.

Figure 3:
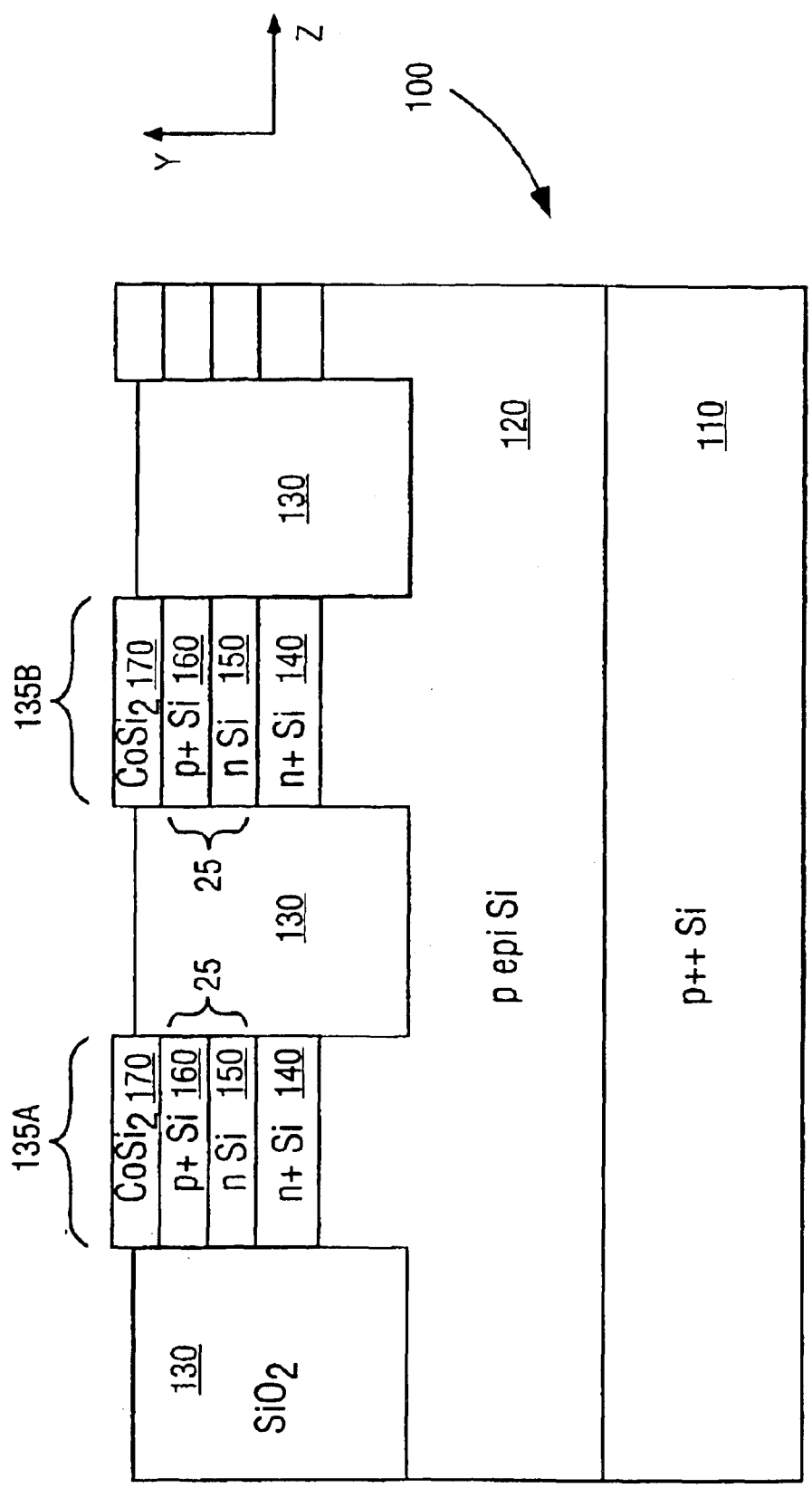
FIG. 3 shows the structure of FIG. 2, through the same cross-section elevational view, after the introduction of dopants to form an isolation device for a memory element in accordance with one embodiment of the invention.

FIG. 3 shows the structure of FIG. 2 after a further fabrication operation in memory cell regions 135A and 135B. In one embodiment, memory cell regions 135A and 135B are introduced as strips with the x-direction dimension greater than the z-direction dimension. Overlying epitaxial portion 120 of substrate 100 is first conductor or signal line material 140. In one example, first conductor or signal line material 140 is N-type doped polysilicon formed by the introduction of, for example, phosphorous or arsenic to a concentration on the order of about $10^{18}$–$10^{19}$ atoms/cm$^3$ such as N$^+$ silicon. In this example, first conductor or signal line material 140 serves as an address line, a row line such as row line 20 of FIG. 1. Overlying first conductor or signal line material 140 is an isolation device such as isolation device 25 of FIG. 1. In one example, isolation device 25 is a PN diode formed of N-type silicon portion 150 that may have a dopant concentration on the order of about $10^{17}$–$10^{18}$ atoms/cm$^3$ and P-type silicon portion 160 that may have a dopant concentration on the order of about $10^{19}$–$10^{20}$ atoms/cm$^3$. Although a PN diode is shown, it is to be appreciated that other isolation structures are similarly suitable. Such isolation devices include, but are not limited to, MOS devices.

Referring to FIG. 3, overlying isolation device 25 in memory cell regions 135A and 135B is a reducer material 170 of, in this example, a refractory metal silicide such as cobalt silicide (CoSi$_2$). Reducer material 170, in one aspect, serves as a low resistance material in the fabrication of peripheral circuitry such as addressing circuitry of the circuit structure on the chip. Thus, reducer material 170 may not be required in terms of forming a memory element as described. Nevertheless, because of its low resistance property, its inclusion as part of the memory cell structure between isolation device 25 and memory element 30 is utilized in this embodiment.

Figure 4:
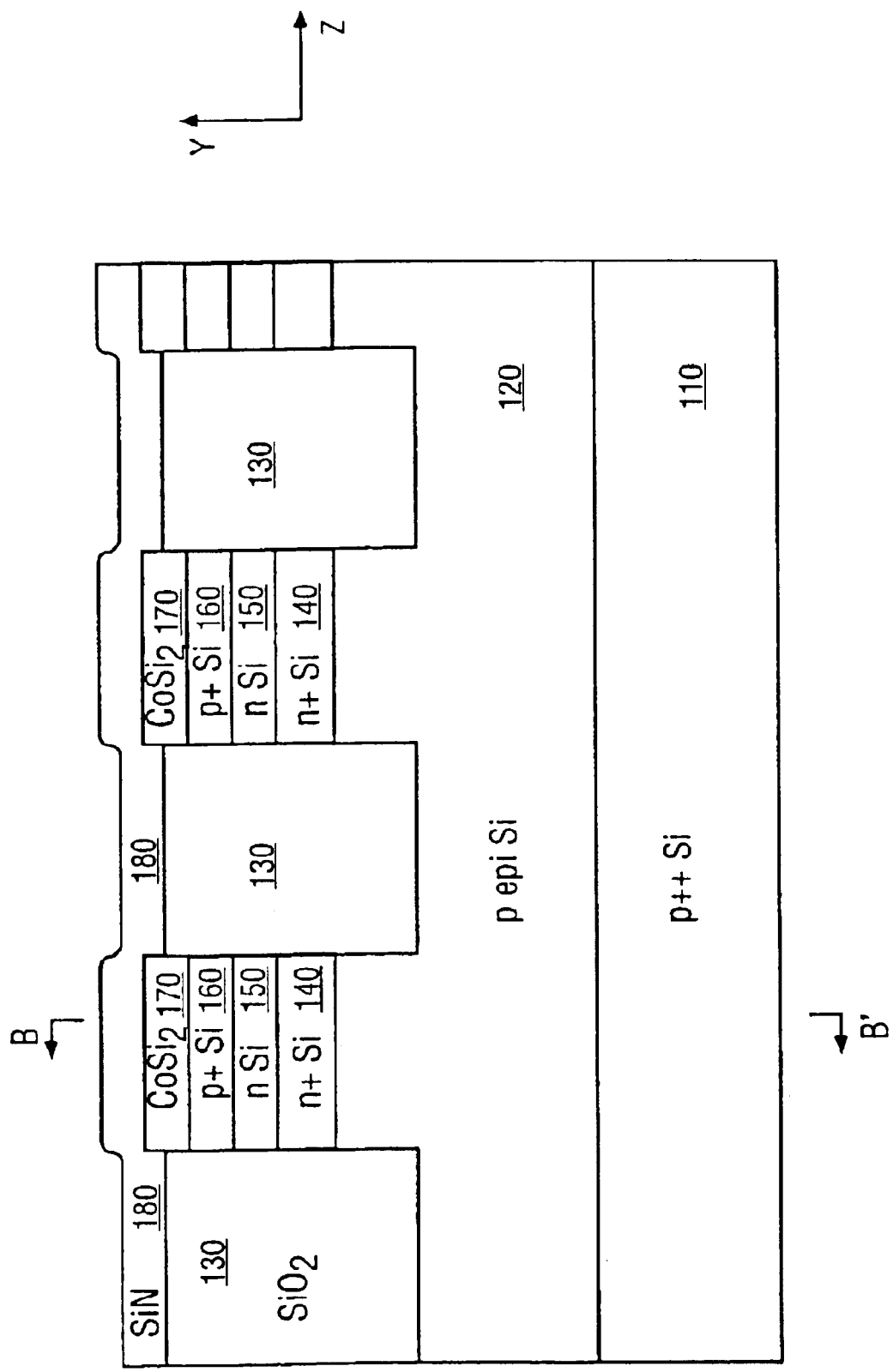
FIG. 4 shows the structure of FIG. 3 after the introduction of a masking material over the structure in accordance with one embodiment of the invention.
Figure 5:
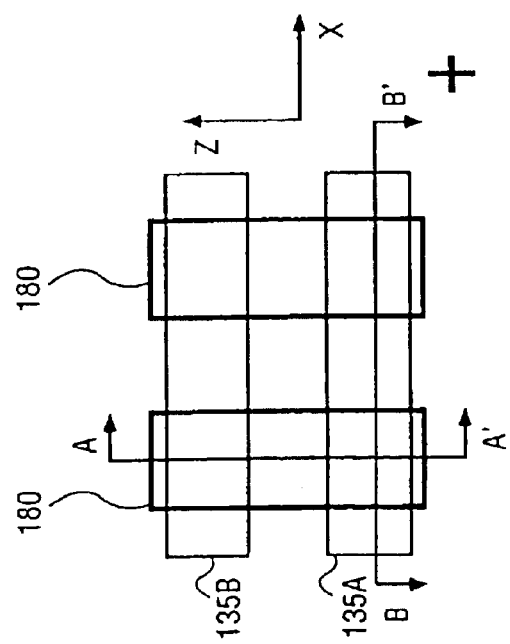
FIG. 5 shows a schematic top view of the structure of FIG. 4.
Figure 6:
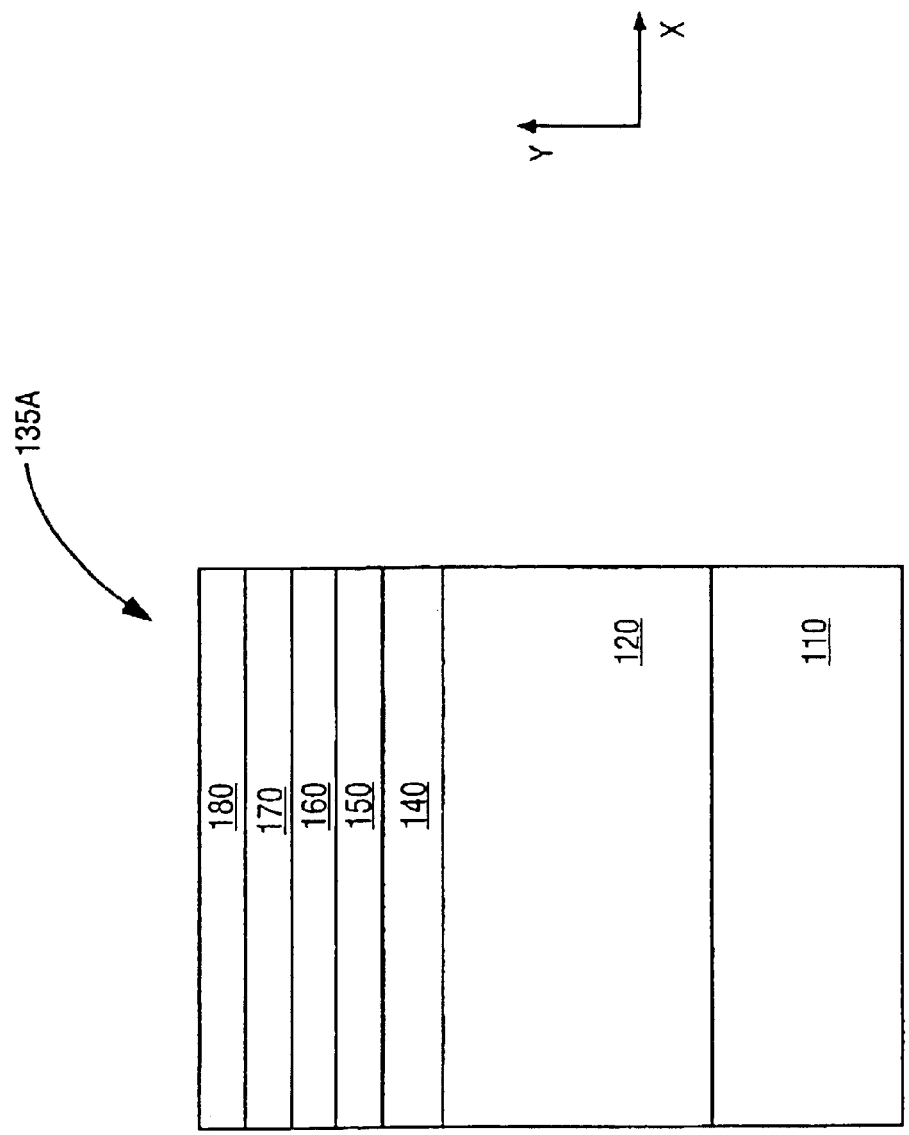
FIG. 6 shows the cross-section of the structure of FIG. 4 through line B–B'.

FIG. 4 shows the structure of FIG. 3 after the introduction of a masking material 180. As will become clear later, masking material 180 serves, in one sense, as an etch stop for a subsequent etch operation. FIG. 5 schematically shows memory cell regions 135A and 135B in an xz plane. Overlying the memory cell is masking material 180. FIG. 6 shows a cross-sectional side view of memory cell region 135A through line B–B' of FIG. 5 in an xy perspective. In one embodiment, a suitable material for masking material 180 is a dielectric material such as silicon nitride ($Si_3N_4$) although other material may be used such as an organic resist.

Figure 7:
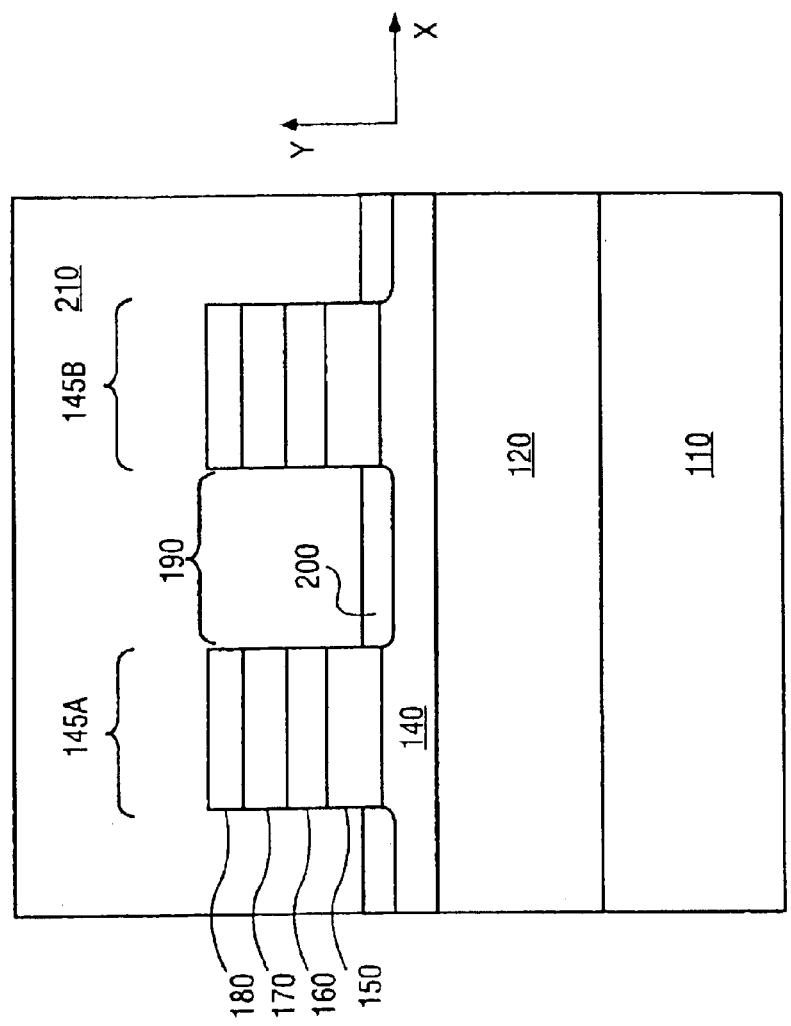
FIG. 7 shows the structure of FIG. 5, through the same cross-section elevational view, after the patterning of the x-direction thickness of a memory cell, the introduction of a dopant between the cells, and the introduction of a dielectric material over the structure.

FIG. 7 shows the structure of FIG. 6 from an xy perspective after patterning of the x-direction thickness of the memory cell material to form a trench 190. FIG. 7 shows two memory cells 145A and 145B patterned from memory cell region 135A depicted in FIG. 5. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch at this point.

Following the patterning, N-type dopant is introduced at the base of each trench 190 to form pockets 200 having a dopant concentration on the order of about $10^{18}$–$10^{20}$ atoms/$cm^3$ to form an $N^+$ region between memory cells 145A and 145B. Pockets 200 serve, in one sense, to maintain continuity of a row line. Dielectric material 210 of, for example, silicon dioxide material is then introduced over the structure to a thickness on the order of 100 Å to 50,000 Å.

Figure 8:
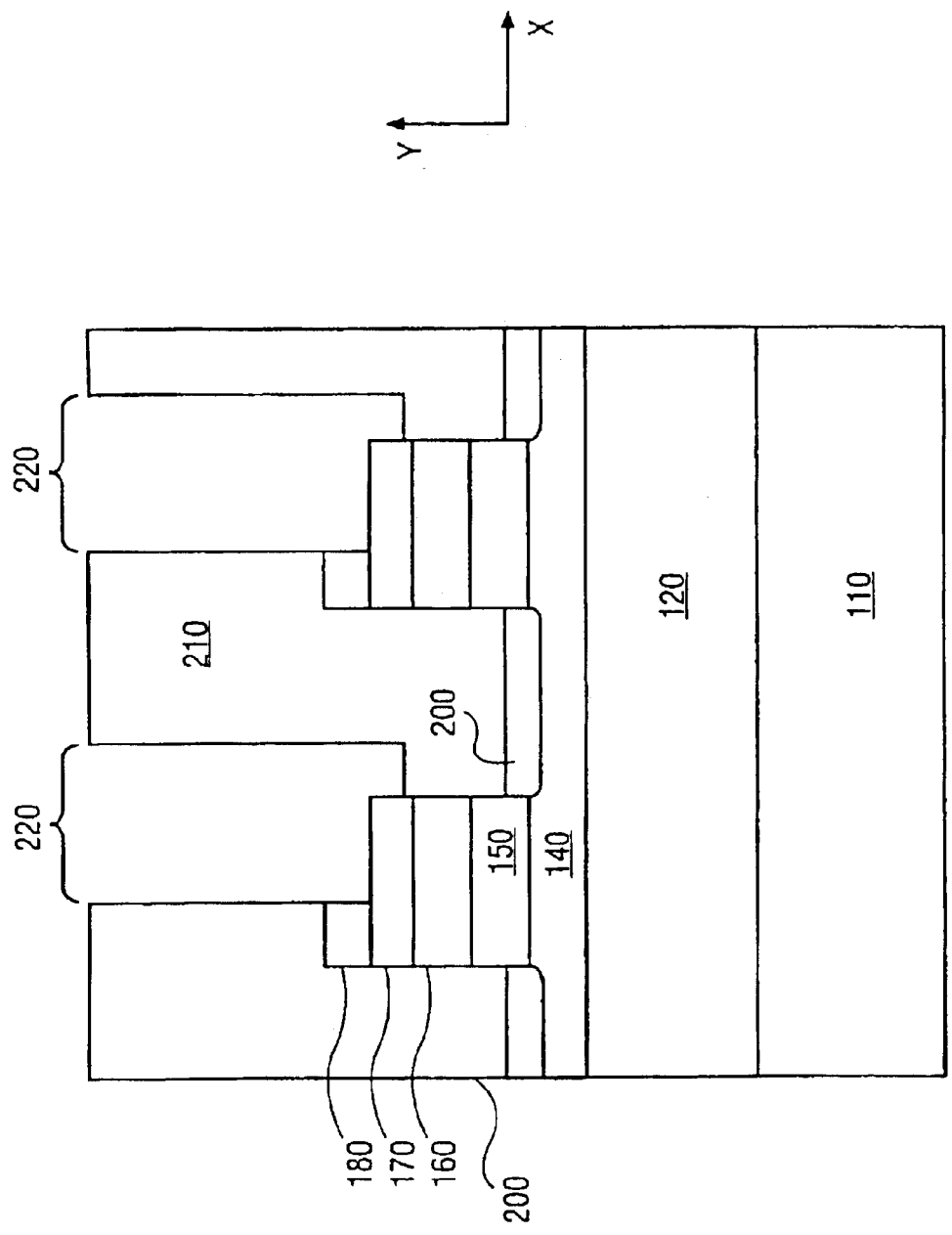
FIG. 8 shows the structure of FIG. 7, through the same cross-section elevational view, after the formation of trenches through the dielectric material in accordance with one embodiment of the invention.

FIG. 8 shows the structure of FIG. 7 after the formation of trenches 220 through dielectric materials 210 and masking material 180 to reducer material 170. The formation of trenches 220 may be accomplished using etch patterning with an etchant(s) for etching dielectric material 210 and masking material 180 and selective to reducer material 170 such that reducer 170 may serve as an etch stop.

Figure 9:
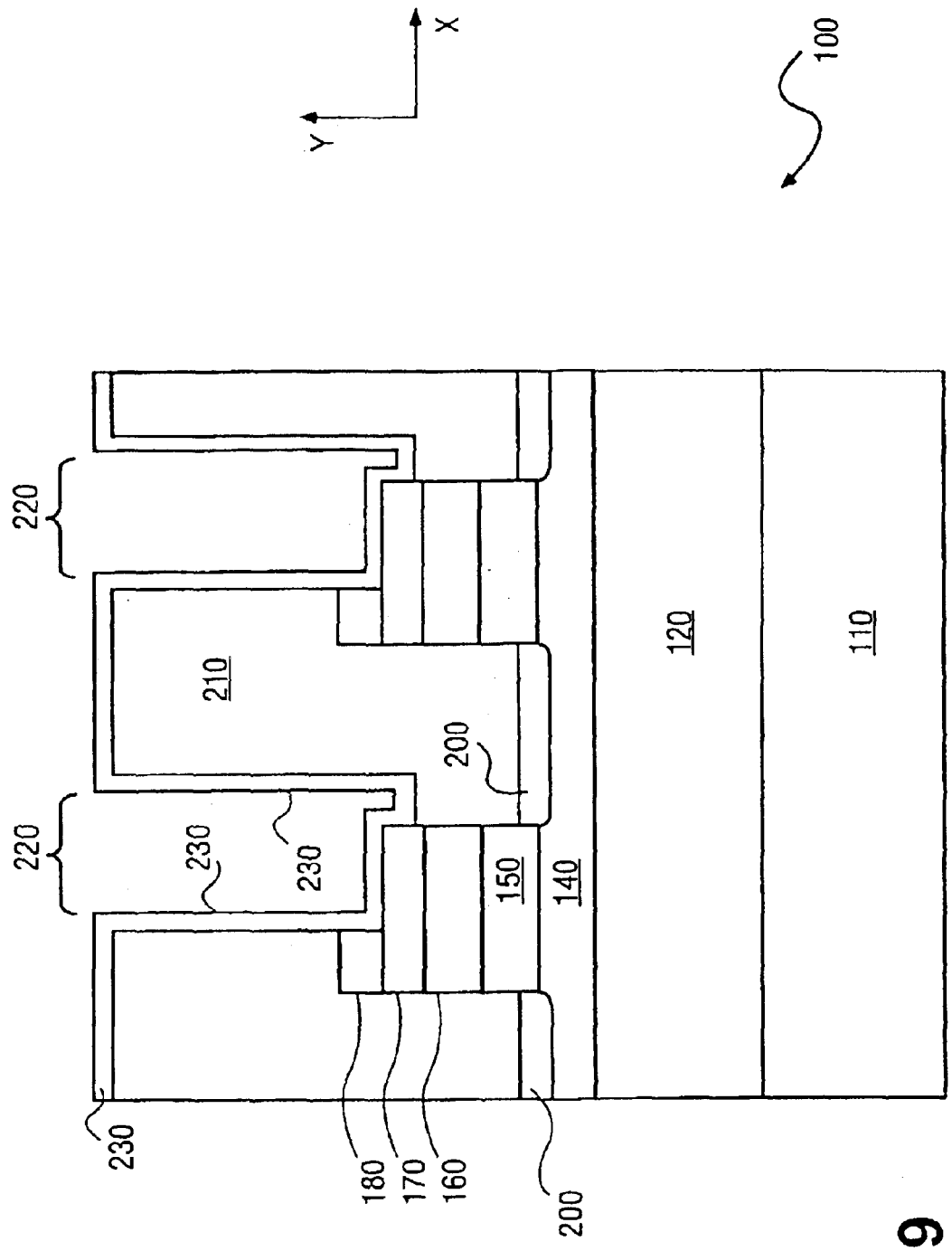
FIG. 9 shows the structure of FIG. 8, through the same cross-section elevational view, after the introduction of an electrode material over the structure in accordance with one embodiment of the invention.

FIG. 9 shows the structure of FIG. 8 after the conformal introduction of electrode material 230. In one example, electrode material 230 is polycrystalline semiconductor material such as polycrystalline silicon. In another embodiment, the electrode material 230 is a metal compound film that is made from a refractory metal and at least one of nitrogen and-silicon. The introduction is conformal in the sense that electrode material 230 is introduced along the side walls and base of trench 220 such that electrode material 230 is in contact with reducer material 170. The conformal introduction of electrode material 230 that is a deposition process, may follow conventional introduction techniques known to those skilled in the art including chemical vapor deposition (CVD) techniques and physical vapor deposition (PVD) techniques.

Figure 10:
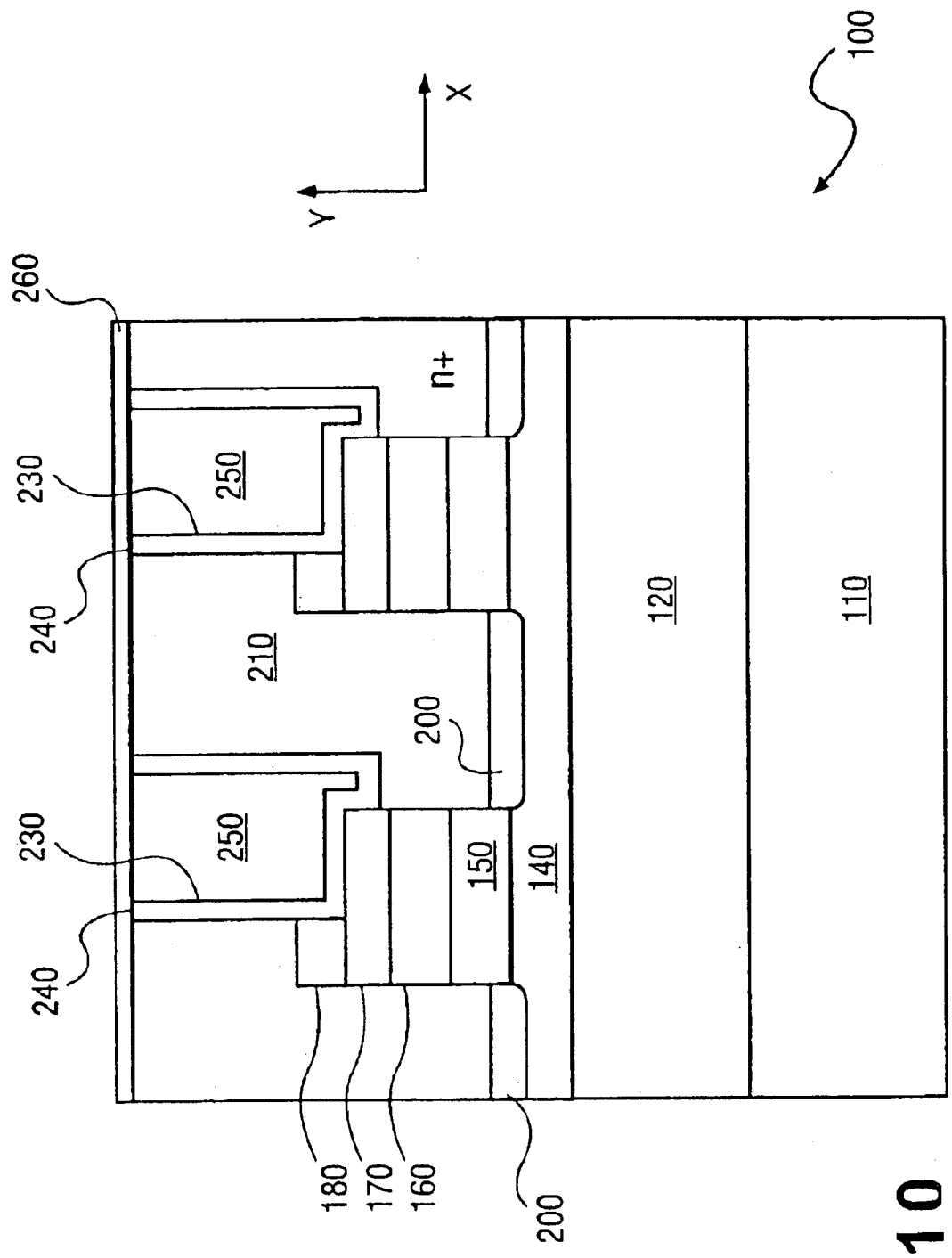
FIG. 10 shows the structure of FIG. 9, through the same cross-section elevational view, after planarization and the formation of an optional adhesion layer.

For simplicity, electrode material 230 is presumed to be deposited and treated, if necessary, such that the inventive process may continue. FIG. 10 is an illustration of substrate 100 after introducing a second dielectric 250 into recess 280, and after planarization processing such as chemical mechanical planarization (CMP) to form a lower electrode upper surface 240. After CMP, an optional adhesion layer 260 is formed over lower electrode upper surface 240. Adhesion layer 260 may be selected from Ti, Zr, and the like. Adhesion layer 260 may also be selected from W and the like. Adhesion layer 260 may also be selected from, TiN, ZrN, WN, and the like. Adhesion layer 260 may also be selected from TiSiN, ZrSiN, WSiN, and the like.

Figure 11:
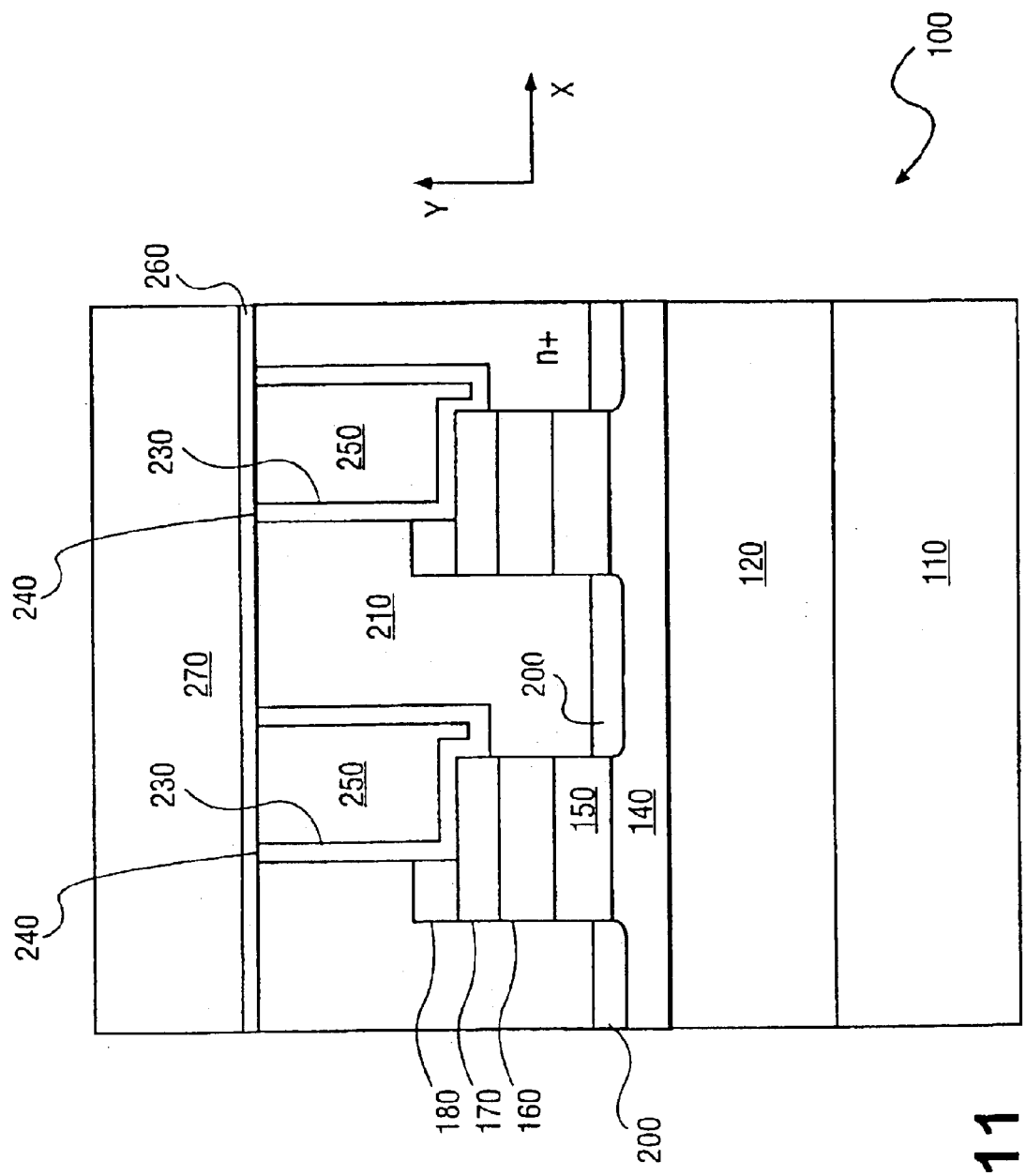
FIG. 11 shows the structure of FIG. 10, through the same cross-section elevational view, after the formation of a dielectric layer that may be referred to as an interlayer dielectric (ILD) layer.

FIG. 11. shows the structure of FIG. 10 after further processing. After the formation of optional adhesion layer 260, an ILD layer 270 is formed over lower electrode upper surface 240 that will serve as a portion of the damascene structure of the present invention. ILD layer 270 may be referred to as a dielectric layer 270.

Figure 12:
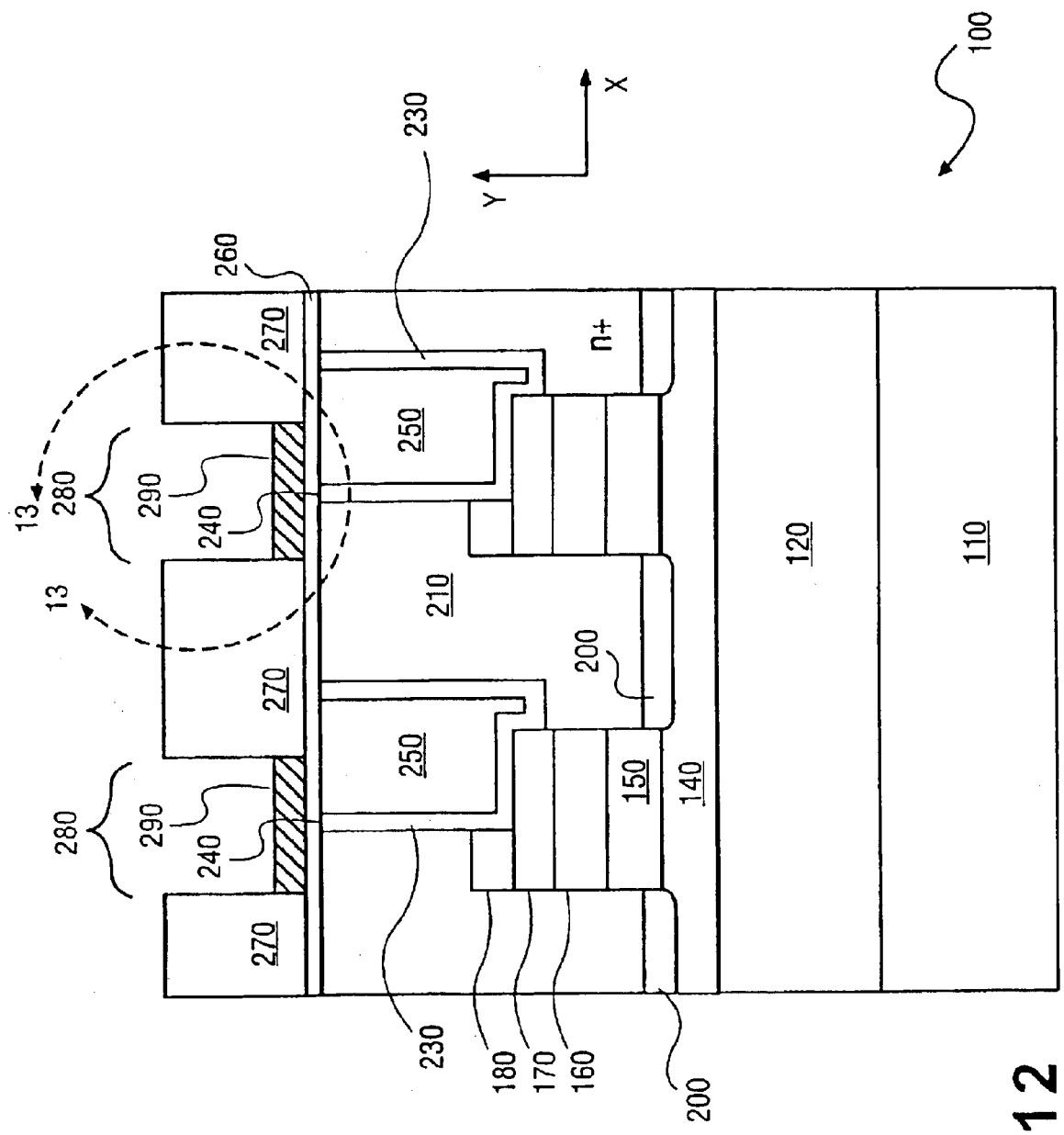
FIG. 12 shows the structure of FIG. 11 through the same cross-section elevational view, after formation of a recess, and the introduction of a volume of memory material of phasechange type into the recess.

FIG. 12 illustrates substrate 100 after further processing. A recess 280 is formed in dielectric layer 270. Recess 280 exposes lower-electrode upper surface 240. It may also be understood that exposing lower electrode upper surface 240 may actually be exposing adhesion layer 260 that may be in direct contact with lower electrode upper surface 240. In any event, a phase-change material 290, also referred to as a memory material is formed in recess 280 that is in contact with lower electrode upper surface 240. Where adhesion layer 260 is present, it is understood that phase-change material 290 is in contact with lower electrode upper surface 240 through the medium of adhesion layer 260.

Figure 13A:
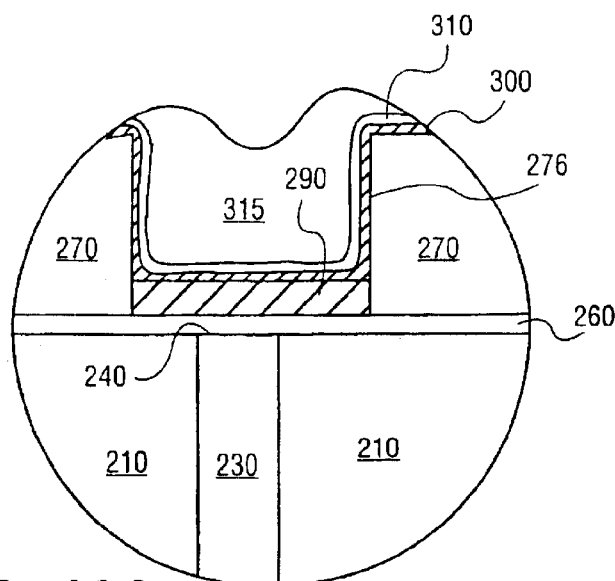
FIGS. 13a, 13b, and 13c show detail sections that illustrate alternative processing of the present invention.

FIG. 13a is a detail section taken along the line 13—13 from FIG. 12. FIG. 13a illustrates a portion of substrate 100 after further processing. In FIG. 13a, lower electrode 230 is depicted disposed in dielectric material 210, and lower electrode upper surface 240 is disposed adjacent the optional adhesion layer 260. Recess 280 in dielectric layer 270 has been filled with an electrically conductive material 315 that will become a select line such as a row select or a column select Optionally, recess 270 is first prepared with at least one barrier layer. In FIG. 13a, a first barrier layer 300 is conformally deposited in the recess over lower electrode upper surface 240. Alternatively, a second barrier layer 310 is formed over first barrier layer 300. The process of forming first barrier layer 300 and alternatively second barrier layer 310 may be carried out by CVD or PVD. Where the select line electrode that will be primarily made from electrically conductive material 315 is aluminum, first barrier layer 300 is preferably titanium, a titanium alloy, or the like. Second barrier layer 310 may be titanium nitride $Ti_xN_y$ and may be formed in either stoichiometric or other solid solution ratios. Second barrier layer 310 may be formed by PVD or CVD, or it may be thermally formed from a portion of first barrier layer 300.

In another embodiment, where the select line electrode that will be primarily made from electrically conductive material 315 is copper, a copper alloy, or the like, first barrier layer 300 is preferably tantalum, a tantalum alloy, or the like. Second barrier layer 310 may be tantalum nitride $Ta_xN_y$ and may be formed in either stoichiometric or other solid solution ratios. Second barrier layer 310 may be formed by PVD or CVD, or it may be thermally formed from a portion of first barrier layer 300.

Figure 13B:
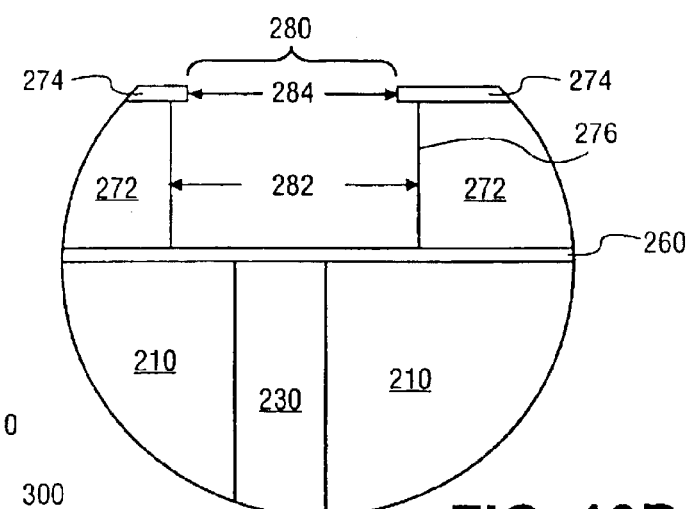

In another embodiment of the present invention, dielectric layer 270 is made of a first dielectric layer 272 and a second dielectric layer 274 as illustrated in FIG. 13b. First dielectric layer 272 and second dielectric layer 274 are made of differing materials such that an etch to form recess 280 will leave a fist breach in first dielectric layer 272 with a first width 282 and a second breach in second dielectric layer 272 with a second width 284. It is illustrated in FIG. 13b that first width 282 is greater than second width 284. As the phase-change material 292 is formed in recess 280 of FIG. 13c, second width 284 acts to cause phase-change material 292 to have a width that may reflect the dimension thereof. By this method, phase-change material 292 has less likelihood of contact to the wall 276 of recess 280.

Figure 13C:
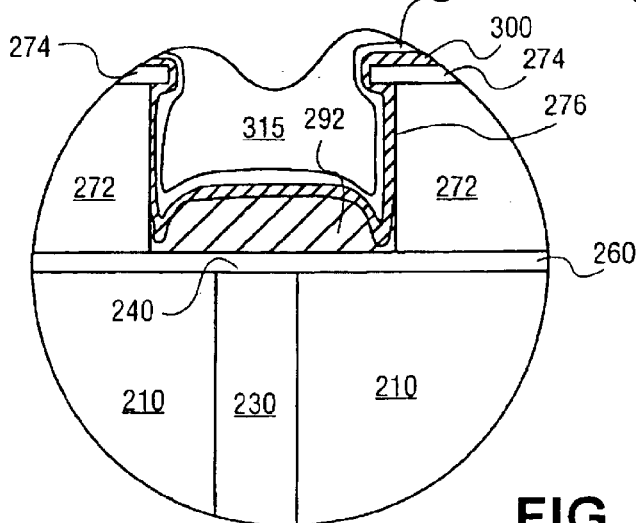

Following the formation of phase-change material 292 first barrier layer 300 and second barrier layer 310 maybe formed as illustrated in FIG. 13c. Because first barrier layer 300 has better adhesion to the wall 276 of recess 280 than phase-change material 292 that is chalcogenide or the like, the use of second dielectric layer 274 therefore facilitates better retention of phase-change material 292 within recess 280 because of a deposition shadow that it casts in the direction of lower electrode 230, either upon adhesion layer 260, or if adhesion layer 260 is not present, upon second dielectric 250. In any event, adhesion of first barrier layer 300 to wall 276 of recess 280 acts as a retainer or "clamp" to hold in, either phase-change material 290 as depicted in FIG. 13a or phase-hange material 292 as depicted in FIG. 13c. Because of the preference to avoid contact of phase-change material 292 with wall 276 of recess 280, PVD is preferably used to thereby create a shadow deposition of phase-change material 292, wherein the shadow is created by second width 284 of second dielectric layer 274. In one embodiment, collimated deposition of phase-change material is used to resist deposition of the memory material upon wall 276. Adhesion strength of first barrier layer 300 is preferably on the order of about 1 kpsi to about 10 kpsi, preferably above about 7 kpsi.

Figure 14:
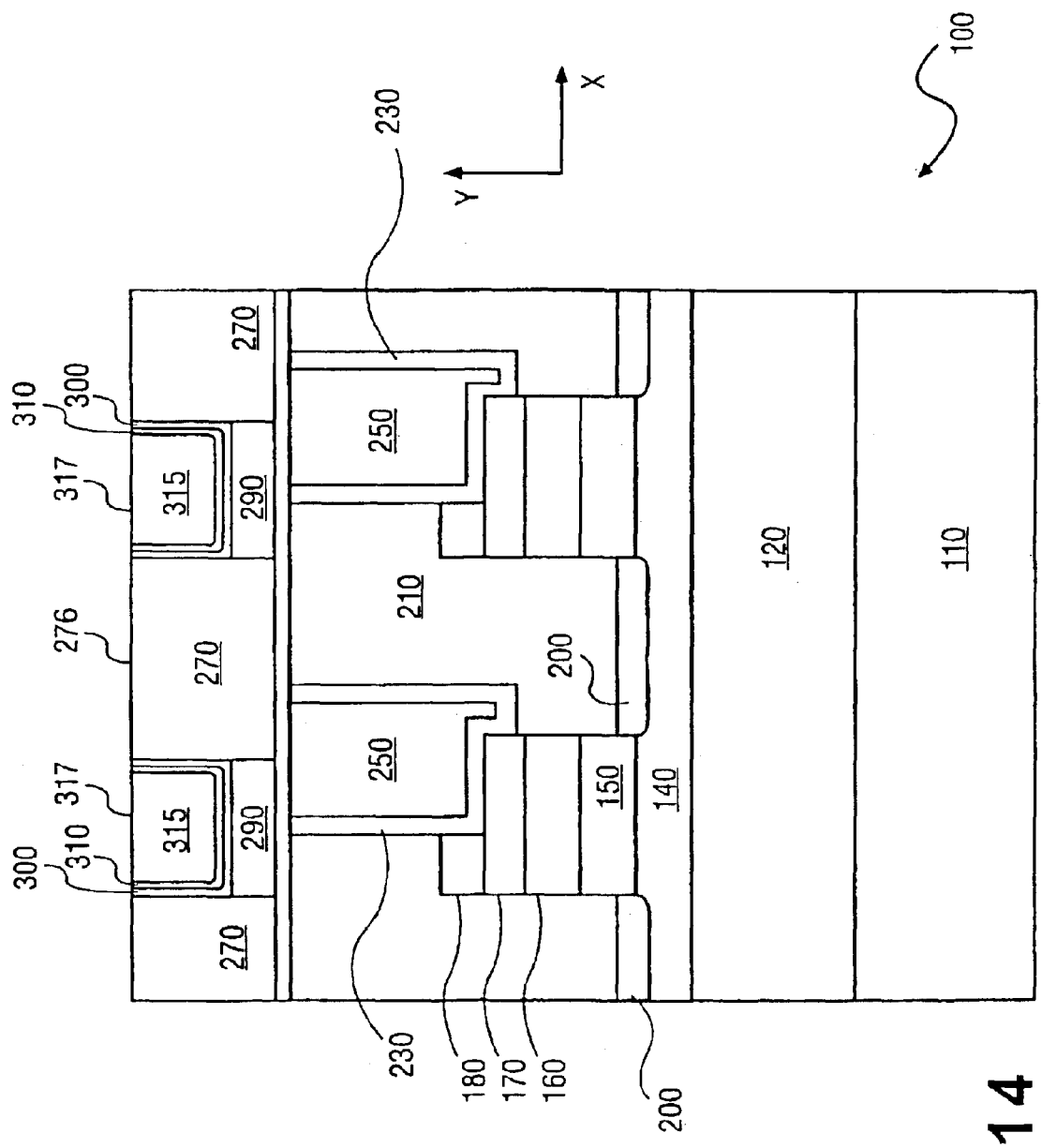
FIG. 14 shows the structure of FIG. 12, through the same cross-section elevational view, after the formation of second conductors over the structure, in accordance with one embodiment of the invention.

FIG. 14 shows the structure of FIG. 12 after the introduction of a volume of memory material 290 (represented as memory element 30 in FIG. 1) after deposition of conductive material 315, and after a CMP process or the like to establish an upper electrode upper surface 317. In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material. The volume of memory material 290, in one example according to current technology, is introduced and patterned with a thickness in a range from about 100 Å to about 1,200 Å, preferably from about 300 A to about 900 Å, and most preferably on the order of about 600 Å.

Overlying the volume of memory material 290 in the structure of FIG. 13, are the barrier materials 300 and 310 of, for example, titanium (Ti) and titanium nitride (TiN), respectively. The barrier materials serve, in one aspect, to inhibit diffusion between the volume of memory material 290 and the second conductor or signal line material 315 overlying the volume of memory material 290 (e.g., second electrode 10 as depicted in FIG. 1). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy, or a copper material such a copper alloy, or the like.

Figure 15:
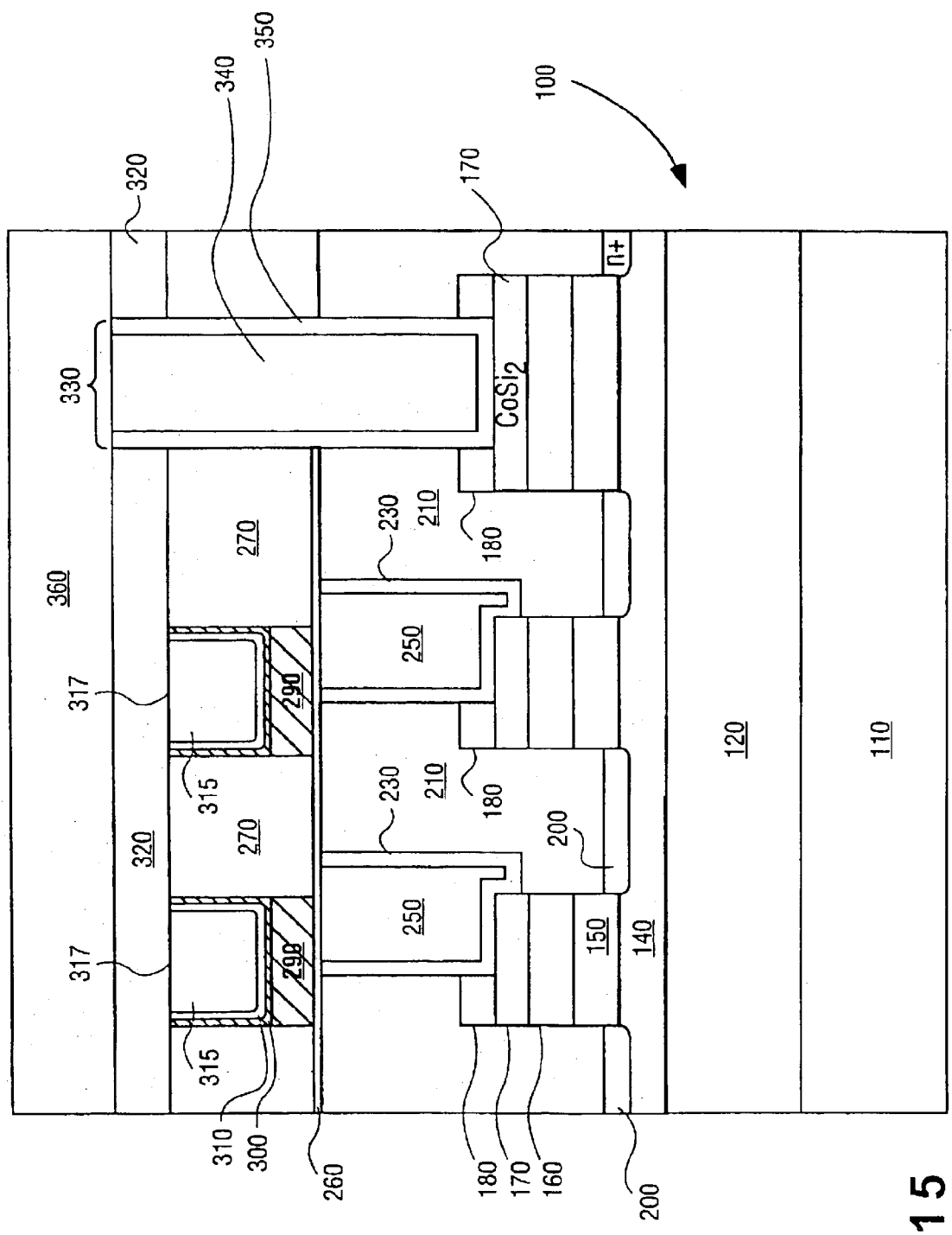
FIG. 15 shows the structure of FIG. 14, through the same cross-section elevational view, after the introduction of an upper dielectric material over the second conductor and after a third is conductor coupled to the first conductor in accordance with an embodiment of the invention.

FIG. 15 shows the structure of FIG. 14 after the introduction of an upper dielectric layer 320 over upper surface 317 of second conductor or signal line material 315. Upper dielectric layer 320 is, for example, $SiO_2$ or other suitable material that overlies both the dielectric layer 270, the second conductor or signal line material 315, and the memory material 290 to electronically isolate such structure. Following introduction, upper dielectric layer 320 is planarized and a via 330 is formed in a portion of the structure through upper dielectric layer 320, dielectric layer 270, dielectric layer 210, and masking material 180 to reducer material 170. The via 330 may be etched in a two-etch process etch. The first etch process may be a fast oxide etch that stops on masking material 180. The second etch process may be a slow nitride etch (if masking material 180 is a nitride) that stops on silicon or silicide. The via 330 is filled with conductive material 340 such as tungsten (W) and barrier material 350 such as a combination of titanium (Ti) and titanium nitride (TiN). Techniques for introducing upper dielectric layer 320, forming and filling conductive vias, and planarizing are known to those skilled in the art.

The structure shown in FIG. 15 also shows additional conductor or signal line material 360 introduced and patterned to mirror that of first conductor or signal line material 140 (e.g., row line) formed on substrate 100. Mirror conductor line material 360, if present, mirrors first conductor or signal line material 140 and is coupled to first conductor or signal line material 140 through a conductive via By mirroring a doped semiconductor such as N-type silicon, mirror conductor line material 360 serves, in one aspect, to reduce the resistance of conductor or signal line material 140 in a memory array, such as memory array 5 illustrated in FIG. 1. A suitable material for mirror conductor line material 360 includes an aluminum material, such as an aluminum alloy, or a copper material such as a copper alloy.

In the above description of forming a memory element such as memory element 15 in FIG. 1, an electrode is described between a memory material and conductors or signal lines (e.g., row lines and column lines) that has improved electrical characteristics. In a first embodiment, the resistivity of the electrode is modified by fabricating an electrode of a first material (polycrystalliine silicon) having a first resistivity and a second material (e.g., SiC/poly or $SiO_2$/poly) of a second higher resistivity. The higher resistivity material is located adjacent, either proximally or directly, the volume of memory material. In this manner, a supplied voltage from second conductor or signal line material 320 or first conductor or signal line material 140 to the memory material may be near the volume of memory material and dissipation of energy to cause a phase change may be minimized. In a second embodiment, the resistivity of the electrode is established by formation a metal compound film such as a refractory metal. The device uses a lower electrode material that is a high resistivity metal compound. The high resistivity metal compound may be a refractory metal compound such as TaN, TIN, WN, TaSN, TiSIN, WSiN, TaSi, TiSi, and WSi.

The discussion detailed the formation of one memory element 30 of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 16:
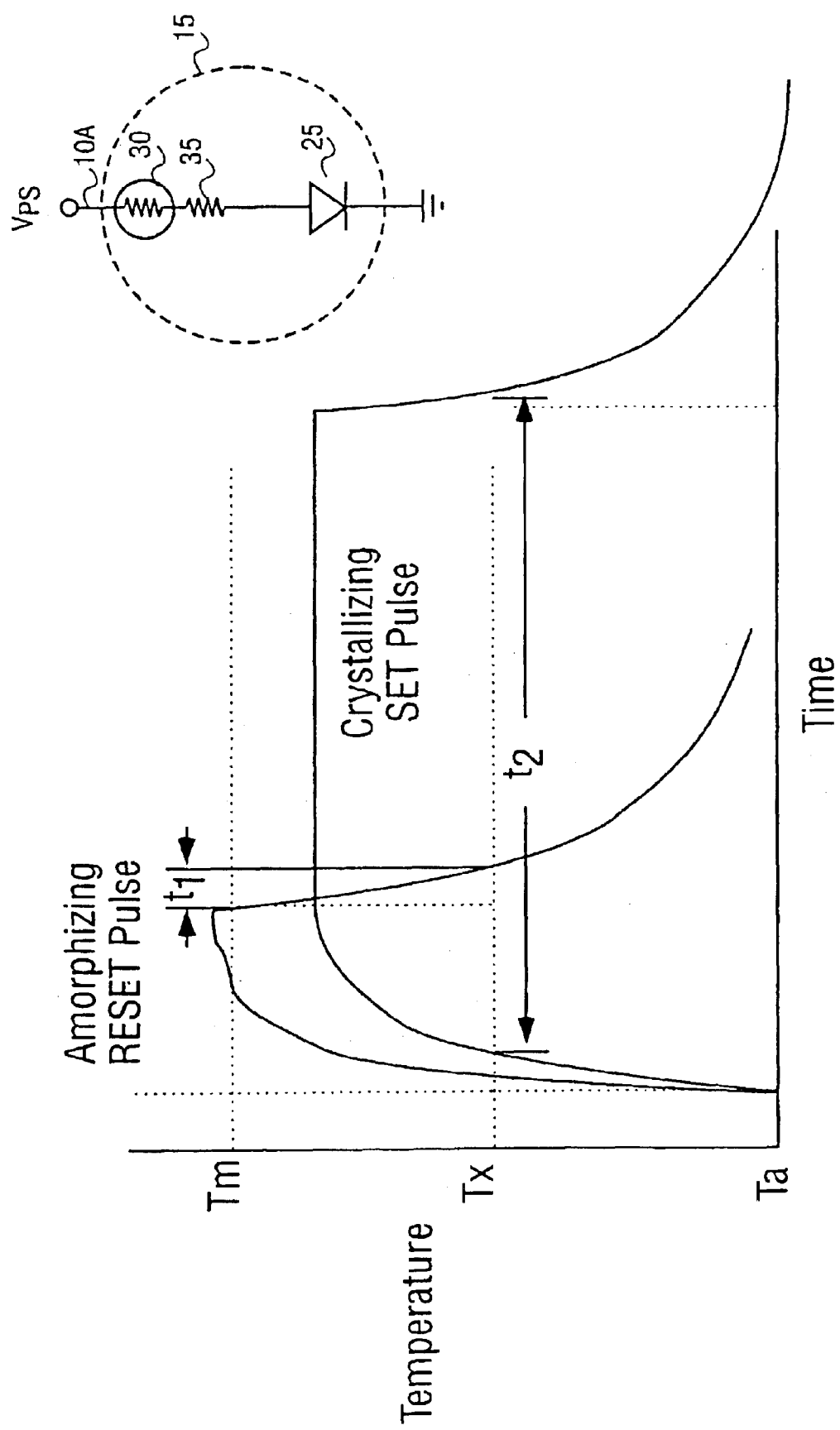
FIG. 16 shows a graphical representation of setting and resetting a volume of a phase change memory material in terms of temperature and time.

FIG. 16 presents a graphical representation of the setting and resetting of a volume of phase change memory material. Referring to FIG. 1, setting and resetting memory element 15 (addressed by column line 10a and row line 20a) involves, in one example, supplying a voltage to column line 10a to introduce a current into the volume of memory material 30. The current causes a temperature increase at the volume of memory material 30. Referring to FIG. 16, to amorphize a volume of memory material, the volume of memory material is heated to a temperature beyond the amorphisizing temperature, $T_M$. Once a temperature beyond TM is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. Another way is to use a metal compound film as described above. The inset of FIG. 16 shows memory cell IS having an electrode with modified portion 35 (illustrated as a resistor) to concentrate heat (current) at the volume of memory material 30.

In the preceding example, the volume of memory material 30 was heated to a high temperature to amorphize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposit& convention may be adopted. It is also to be appreciated from this example that the volume of memory material 30 need not be partially set or reset by varying the current flow and duration through the volume of memory material.

In one embodiment of the present invention, better wall adhesion of first barrier layer 300 is achieved, in the place of phase-change material 292. In other words, phase-change material 292 is clamped in place by the presence of first barrier layer 300. In another embodiment, better wall adhesion of first barrier layer 300 is achieved, in the place of phase-change material 290. In other words, phase-change material 290 is clamped in place by the presence of first barrier layer 300.

Where phase-change material 290 is a chalcogenide material or the like, it is very sensitive to both wet and elevated temperature processing. Chalcogenide material is very reactive to standard wet chemistries that are used in semiconductor fabrication; they are difficult to protect during wet processing. Chalcogenide material is also relatively volatile during elevated temperature processing such as the formation of an ILD layer. During processing of the prior state of the art, the elevated thermal processing to form an ILD layer over the metal stack in a level that is the same or similar to the location of dielectric layer 270 would cause a significant portion of phase-change material to volatilize by sublimation. By the present invention, dielectric layer 270 is formed before the introduction of phase-change material 290, and before the next elevated temperature process, phase-change material 290 has been substantially trapped beneath at least one sealing layer such as first barrier layer 300 or such as electrically conductive material 315.

It will be-readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A phase change memory cell comprising:
    a lower electrode disposed in a substrate, the lower electrode having an upper surface;
    a phase change memory material disposed over the lower electrode upper surface;
    a dielectric layer disposed over the substrate, the dielectric layer having an upper surface and a recess that communicates to the lower electrode upper surface; and
    a damascene upper electrode disposed in the recess, wherein an upper surface of the damascene upper electrode is substantially coplanar to the upper surface of the dielectric layer.

2. The phase change memory cell according to claim 1, further comprising:
    an adhesion layer, over the lower electrode upper surface, and in contact with the phase-change memory material.

3. The phase-change memory cell according to claim 1, wherein the dielectric layer further comprises:
    a first dielectric layer; and
    a second dielectric layer disposed over the first dielectric layer.

4. The phase-change memory cell according to claim 3, wherein the first dielectric layer has a first breach with a first width, and wherein the second dielectric layer has a second breach with a second width that is less than the first width.

5. The phase-change memory cell according to claim 1, further comprising:
    a first barrier layer disposed in the recess and over the lower electrode upper surface.

6. The phase-change memory cell according to claim 1, further comprising:
    a first barrier layer disposed in the recess and over the lower electrode upper surface, wherein the first barrier layer is Ti.

7. The phase-change memory cell according to claim 6, further comprising:
    a second barrier layer disposed over the first barrier layer.

8. The phase-change memory cell according to claim 7, wherein the second barrier layer is TiN and the electrically conductive material is selected from Al and Al alloys.

9. The phase-change memory cell according to claim 5, wherein the first barrier layer is Ta.

10. The phase-change memory cell according to claim 9, further comprising:
    a second barrier layer disposed over the first barrier layer.

11. The phase-change memory cell according to claim 10, wherein the second barrier layer is TaN and the electrically conductive material is selected from Cu and Cu alloys.

12. The phase-change memory cell according to claim 1, further comprising:
    an adhesion layer disposed in the recess.

13. The phase-change memory cell according to claim 1, further comprising:
    an adhesion layer disposed over the lower electrode upper surface, wherein the adhesion layer is selected from Ti, W, TiN, WN, TiSiN, and WSiN.

14. A memory comprising:
    a memory cell, wherein the memory cell includes:
    a lower electrode having an upper surface;
    a phase change material over the lower electrode;
    an upper electrode over the phase change material; and
    wherein the upper electrode has a damascene disposition in a dielectric layer, the dielectric layer having an upper surface that is substantially coplanar to an upper surface of the upper electrode.

15. The memory according to claim 14, wherein the dielectric layer includes:
a first dielectric layer having a first breach with a first width; and
a second dielectric layer disposed over the first dielectric layer, the second dielectric layer having a second breach with a second width that is lesser than the first width.

16. The memory according to claim 14, wherein the memory cell further includes:
a first barrier layer coupled between the phase change material and the upper electrode; and
a second barrier layer coupled between the first barrier layer and the second barrier layer, wherein the first barrier layer is selected from Ti, Ti alloys, Ta, and Ta alloys, and wherein the second barrier layer is selected from nitrides of the Ti, Ti alloys, Ta, and Ta alloys.

17. The memory according to claim 14, wherein the memory cell further includes:
an adhesion layer coupled between the lower electrode and the phase change material, wherein the adhesion layer is selected from Ti, W, TiN, WN, TiSiN, and WSiN.

18. An apparatus, comprising:
an electrode;
a dielectric material;
a memory material over the electrode; and
an electrically conductive material over the memory material, wherein an upper surface of the electrically conductive material is substantially coplanar to an upper surface of the dielectric material.

19. The apparatus of claim 18, wherein the memory material is a phase change material.

20. The apparatus of claim 18, wherein the memory material is a chalcogenide material.

21. The apparatus of claim 18, wherein the electrically conductive material is over the memory material.

22. The apparatus of claim 18, wherein the memory material and the electrically conductive material are located in a recess formed in the dielectric material.

23. The apparatus of claim 18, wherein the electrode is polycrystalline silicon.

24. The apparatus of claim 18, wherein the electrically conductive material comprises copper or aluminum.

25. The apparatus of claim 18, wherein the electrically conductive material is a first address line.

26. The apparatus of claim 25, further comprising a second address line coupled and substantially or orthogonal to the electrically conductive material.

27. The apparatus of claim 26, wherein the second address line is N-type doped silicon.

28. The apparatus of claim 26, further comprising an isolation device coupled between the electrode and the second address line.

29. The apparatus of claim 18, further comprising a first barrier material coupled between the memory material and the electrically conductive material.

30. The apparatus of claim 29, wherein the first barrier material is comprised of titanium (Ti) or tantalum (Ta).

31. The apparatus of claim 30, further comprising a second barrier material coupled between the first barrier material and the electrically conductive material.

32. The apparatus of claim 31, wherein the second barrier material is titanium nitride (TiN) or tantalum nitride (TaN).

33. The apparatus of claim 18, further comprising an adhesion material coupled between the memory material and the electrode.

34. The apparatus of claim 33, wherein the adhesion material is either Ti, Zr, W, TiN, WN, ZrN, TiSiN, ZrSiN, or WSiN.

35. The apparatus of claim 18,
further comprising a second dielectric material over the electrically conductive material and the dielectric material, wherein a lower surface of the second dielectric material contacts an upper surface of the electrically conductive material and a lower surface of the second dielectric material contacts an upper surface of the dielectric material.

36. The apparatus of claim 18, wherein the electrically conductive material and the dielectric material form a damascene structure.

37. An apparatus, comprising:
an electrode;
a first dielectric material;
a memory material over the electrode; and
an electrically conductive material over the memory material; and
a second dielectric material over the electrically conductive material and the first dielectric material, wherein a lower surface of the second dielectric material contacts an upper surface of the electrically conductive material and the lower surface of the second dielectric material contacts an upper surface of the first dielectric material.

38. The apparatus of claim 37, wherein the electrically conductive material is a second electrode.

39. The apparatus of claim 37, further comprising a third dielectric material under the memory material and under the first dielectric material, wherein an upper surface of the electrode is substantially coplanar to an upper surface of the first dielectric material.

40. The apparatus of claim 37, wherein the electrode is planarized using a chemical mechanical planarization (CMP) process.

41. The apparatus of claim 37, wherein the electrically conductive material is a planarized electrode and wherein an upper surface of the electrically conductive material is substantially coplanar to an upper surface of the first dielectric material.

42. The apparatus of claim 37, wherein the memory material is a phase change material and wherein an upper surface of the electrode is substantially coplanar to an upper surface of the first dielectric material.

43. The apparatus of claim 37, wherein the memory material is a chalcogenide material.

44. The apparatus of claim 37, wherein the memory material and the electrically conductive material are located in a recess formed in the first dielectric material.

45. The apparatus of claim 37, wherein the electrode is polycrystalline silicon.

46. The apparatus of claim 37, wherein the electrically conductive material comprises copper or aluminum.

47. The apparatus of claim 37, wherein the electrically conductive material is a first address line.

48. The apparatus of claim 47, further comprising a second address line coupled to the electrode and substantially orthogonal to the electrically conductive material.

49. The apparatus of claim 48, wherein the second address line is N-type doped silicon.

50. The apparatus of claim 48, further comprising an isolation device coupled between the electrode and the second address line.

51. The apparatus of claim 37, further comprising a barrier material coupled between the memory material and the electrically conductive material.

52. The apparatus of claim 51, wherein the barrier material comprises titanium (Ti).

53. The apparatus of claim 51, wherein the barrier material is titanium nitride (TiN) or tantalum nitride (TaN).

54. The apparatus of claim 37, further comprising a first barrier material coupled between the memory material and the electrically conductive material.

55. The apparatus of claim 51, wherein the first barrier material is comprised of titanium (Ti) or tantalum (Ta).

56. The apparatus of claim 54, further comprising a second barrier material coupled between the first barrier material and the electrically conductive material.

57. The apparatus of claim 56, wherein the second barrier material is titanium nitride (TiN) or tantalum nitride (TaN).

58. The apparatus of claim 37, further comprising an adhesion material coupled between the memory material and the electrode.

59. The apparatus of claim 58, wherein the adhesion material is either Ti, Zr, W, TiN, WN, ZrN, TiSiN, ZrSiN, or WSiN.

60. The apparatus of claim 37, wherein the second dielectric material comprises silicon dioxide.

61. The apparatus of claim 37, wherein the electrically conductive material and the first dielectric material form a damascene structure.

62. The apparatus of claim 37, wherein the upper surfaces of the electrically conductive material and the first dielectric material form a substantilly planar surface and the second dielectric material is formed on the substantially planar surface.

* * * * *

UNITED STATES PATENT AND TRADEMARK OFFICE
CERTIFICATE OF CORRECTION

PATENT NO. : 6,797,979 B2
DATED : September 28, 2004
INVENTOR(S) : Chiang et al.

It is certified that error appears in the above-identified patent and that said Letters Patent is hereby corrected as shown below:

Column 3,
Line 38, delete "photonicrograph" and insert -- photomicrograph --.

Column 6,
Line 30, after "select" insert -- . --.
Line 59, delete "fist" and insert -- first --.

Column 7,
Line 14, delete "phase-hange" and insert -- phase-change --.
Line 38, delete "A" and insert -- Å --.

Column 8,
Line 47, delete "TiSIN" and insert -- TiSiN --.

Column 9,
Line 28, delete "opposit&" and insert -- opposite --.

Signed and Sealed this

Twenty-fourth Day of May, 2005

JON W. DUDAS
*Director of the United States Patent and Trademark Office*